(12) United States Patent
Wang et al.

(10) Patent No.: US 11,798,998 B2
(45) Date of Patent: Oct. 24, 2023

(54) SEMICONDUCTOR DEVICE

(71) Applicant: UNITED MICROELECTRONICS CORP., Hsin-Chu (TW)

(72) Inventors: Yi-Chieh Wang, New Taipei (TW); Po-Chun Lai, Taoyuan (TW); Ke-Feng Lin, Taipei (TW); Chen-An Kuo, Taoyuan (TW); Ze-Wei Jhou, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/895,042

(22) Filed: Aug. 24, 2022

(65) Prior Publication Data

US 2022/0406902 A1     Dec. 22, 2022

Related U.S. Application Data

(62) Division of application No. 17/200,908, filed on Mar. 15, 2021, now Pat. No. 11,462,621.

(30) Foreign Application Priority Data

Feb. 9, 2021    (CN) .......................... 202110175890.X

(51) Int. Cl.
| | |
|---|---|
| *H01L 29/76* | (2006.01) |
| *H01L 31/062* | (2012.01) |
| *H01L 29/94* | (2006.01) |
| *H01L 29/40* | (2006.01) |
| *H01L 27/088* | (2006.01) |
| *H01L 29/78* | (2006.01) |

(52) U.S. Cl.
CPC .......... *H01L 29/404* (2013.01); *H01L 27/088* (2013.01); *H01L 29/7816* (2013.01)

(58) Field of Classification Search
CPC ............. H01L 29/66681; H01L 29/404; H01L 29/665; H01L 29/7816; H01L 29/42368; H01L 29/4933; H01L 29/1045; H01L 29/66659; H01L 29/7835; H01L 27/088
USPC ................................................. 257/288, 409
See application file for complete search history.

(56) References Cited

U.S. PATENT DOCUMENTS

| | | |
|---|---|---|
| 5,386,136 A | 1/1995 | Williams |
| 5,825,065 A | 10/1998 | Corsi |
| 6,190,948 B1 | 2/2001 | Seok |
| 7,307,314 B2 | 12/2007 | Babcock |
| 7,374,982 B2 | 5/2008 | Hebert |
| 7,589,378 B2 | 9/2009 | Kocon |
| 7,936,007 B2 | 5/2011 | Marchant |

(Continued)

*Primary Examiner* — Theresa T Doan
(74) *Attorney, Agent, or Firm* — Winston Hsu

(57) ABSTRACT

A semiconductor device includes a semiconductor substrate, a gate structure, a source region, a drain region, and a plurality of field plates. The gate structure is disposed on the semiconductor substrate. The source region and the drain region are disposed in the semiconductor substrate and located at two opposite sides of the gate structure in a first direction respectively. The field plates are disposed on the semiconductor substrate. Each of the field plates is partly located above the gate structure and partly located between the gate structure and the drain region. The gate structure is electrically connected with at least one of the field plates, and the source region is electrically connected with at least one of the field plates.

1 Claim, 13 Drawing Sheets

(56) References Cited

U.S. PATENT DOCUMENTS

2009/0230468 A1* 9/2009 Cai .................... H01L 29/7816
                                                    257/337
2019/0288112 A1   9/2019 Wang
2021/0296451 A1* 9/2021 Chen ................. H01L 21/76829

* cited by examiner

SEMICONDUCTOR DEVICE

CROSS REFERENCE TO RELATED APPLICATIONS

This application is a division of U.S. application Ser. No. 17/200,908, filed on Mar. 15, 2021. The content of the application is incorporated herein by reference.

BACKGROUND OF THE INVENTION

1. Field of the Invention

The present invention relates to a semiconductor device, and more particularly, to a semiconductor device including a field plate.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operation voltage environment such as CPU power supply, power management system, AC/DC converter, and high-power or high frequency band power amplifier. The essential feature of LDMOS transistor device is a lateral-diffused drift region with low doping concentration and large area. The drift region is used to alleviate the high voltage between the drain and the source, and therefore LDMOS transistor device can have higher breakdown voltage. However, as the requirements of related products become higher and higher, how to improve the electrical performance, the voltage endurance or/and power loss of high voltage semiconductor units through design modifications in the structure or/and process is still a continuous issue for those in the relevant fields.

SUMMARY OF THE INVENTION

A semiconductor device is provided in the present invention. A gate structure is electrically connected with at least one of field plates, and a source region is electrically connected with at least one of the field plates for adjusting properties of the semiconductor device, such as on-resistance (Ron), gate charge (Qg), and so forth. Some specific electrical performance of the semiconductor device may be improved and/or the power loss of the semiconductor device may be reduced accordingly.

According to an embodiment of the present invention, a semiconductor device is provided. The semiconductor device includes a semiconductor substrate, a gate structure, a source region, a drain region, and a plurality of field plates. The gate structure is disposed on the semiconductor substrate. The source region and the drain region are disposed in the semiconductor substrate and located at two opposite sides of the gate structure in a first direction respectively. The field plates are disposed on the semiconductor substrate. Each of the field plates is partly located above the gate structure and partly located between the gate structure and the drain region. The gate structure is electrically connected with at least one of the field plates, and the source region is electrically connected with at least one of the field plates.

According to an embodiment of the present invention, a semiconductor device is provided. The semiconductor device includes a semiconductor substrate, a first gate structure, a second gate structure, a first source region, a first drain region, a second source region, a second drain region, a plurality of first field plates, and a plurality of second field plates. The first gate structure and the second gate structure are disposed on the semiconductor substrate. The first source region and the first drain region are disposed in the semiconductor substrate and located at two opposite sides of the first gate structure in a first direction respectively. The second source region and the second drain region are disposed in the semiconductor substrate and located at two opposite sides of the second gate structure in the first direction respectively. The first field plates and the second field plates are disposed on the semiconductor substrate. Each of the first field plates is partly located above the first gate structure and partly located between the first gate structure and the first drain region, and the first gate structure is electrically connected with at least one of the first field plates. Each of the second field plates is partly located above the second gate structure and partly located between the second gate structure and the second drain region, and the second source region is electrically connected with at least one of the second field plates.

According to an embodiment of the present invention, a semiconductor device is provided. The semiconductor device includes a semiconductor substrate, a gate structure, a source region, a drain region, and a plurality of field plates. The gate structure is disposed on the semiconductor substrate. The source region and the drain region are disposed in the semiconductor substrate and located at two opposite sides of the gate structure in a first direction respectively. The field plates are disposed on the semiconductor substrate. Each of the field plates is partly located above the gate structure and partly located between the gate structure and the drain region. The gate structure is electrically connected with more than one of the field plates, and the source region is electrically connected with more than one of the field plates. The field plates electrically connected with the gate structure and the field plates electrically connected with the source region are alternately arranged in a second direction orthogonal to the first direction.

According to an embodiment of the present invention, a semiconductor device is provided. The semiconductor device includes a semiconductor substrate, a gate structure, a source region, a drain region, and a plurality of field plates. The gate structure is disposed on the semiconductor substrate. The source region and the drain region are disposed in the semiconductor substrate and located at two opposite sides of the gate structure in a first direction respectively. The field plates are disposed on the semiconductor substrate. Each of the field plates is partly located above the gate structure and partly located between the gate structure and the drain region. The gate structure is electrically connected with at least one of the field plates, and the source region is electrically connected with at least one of the field plates. A dimension of the field plate electrically connected with the gate structure is different from a dimension of the field plate electrically connected with the source region.

According to an embodiment of the present invention, a semiconductor device is provided. The semiconductor device includes a semiconductor substrate, a first gate structure, a second gate structure, a first source region, a first drain region, a second source region, a second drain region, a plurality of first field plates, and a plurality of second field plates. The first gate structure and the second gate structure are disposed on the semiconductor substrate. The first source region and the first drain region are disposed in the semiconductor substrate and located at two opposite sides of the first gate structure in a first direction respectively. The second source region and the second drain region are disposed in the semiconductor substrate and located at two opposite sides of the second gate structure in the first direction respectively. The first field plates and the second field plates are disposed on the semiconductor substrate. Each of the first field plates is partly located above the first gate structure and partly located between the first gate structure and the first drain region, and the first gate structure is electrically connected with at least one of the first field plates. Each of the second field plates is partly located above the second gate structure and partly located between the second gate structure and the second drain region, and the second source region is electrically connected with at least one of the second field plates. A number of the first field plates is different from a number of the second field plates.

According to an embodiment of the present invention, a semiconductor device is provided. The semiconductor device includes a semiconductor substrate, a first gate structure, a second gate structure, a first source region, a first drain region, a second source region, a second drain region, a plurality of first field plates, and a plurality of second field plates. The first gate structure and the second gate structure are disposed on the semiconductor substrate. The first source region and the first drain region are disposed in the semiconductor substrate and located at two opposite sides of the first gate structure in a first direction respectively. The second source region and the second drain region are disposed in the semiconductor substrate and located at two opposite sides of the second gate structure in the first direction respectively. The first field plates and the second field plates are disposed on the semiconductor substrate. Each of the first field plates is partly located above the first gate structure and partly located between the first gate structure and the first drain region, and the first gate structure is electrically connected with at least one of the first field plates. Each of the second field plates is partly located above the second gate structure and partly located between the second gate structure and the second drain region, and the second source region is electrically connected with at least one of the second field plates. A dimension of at least one of the first field plates is different from a dimension of at least one of the second field plates.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
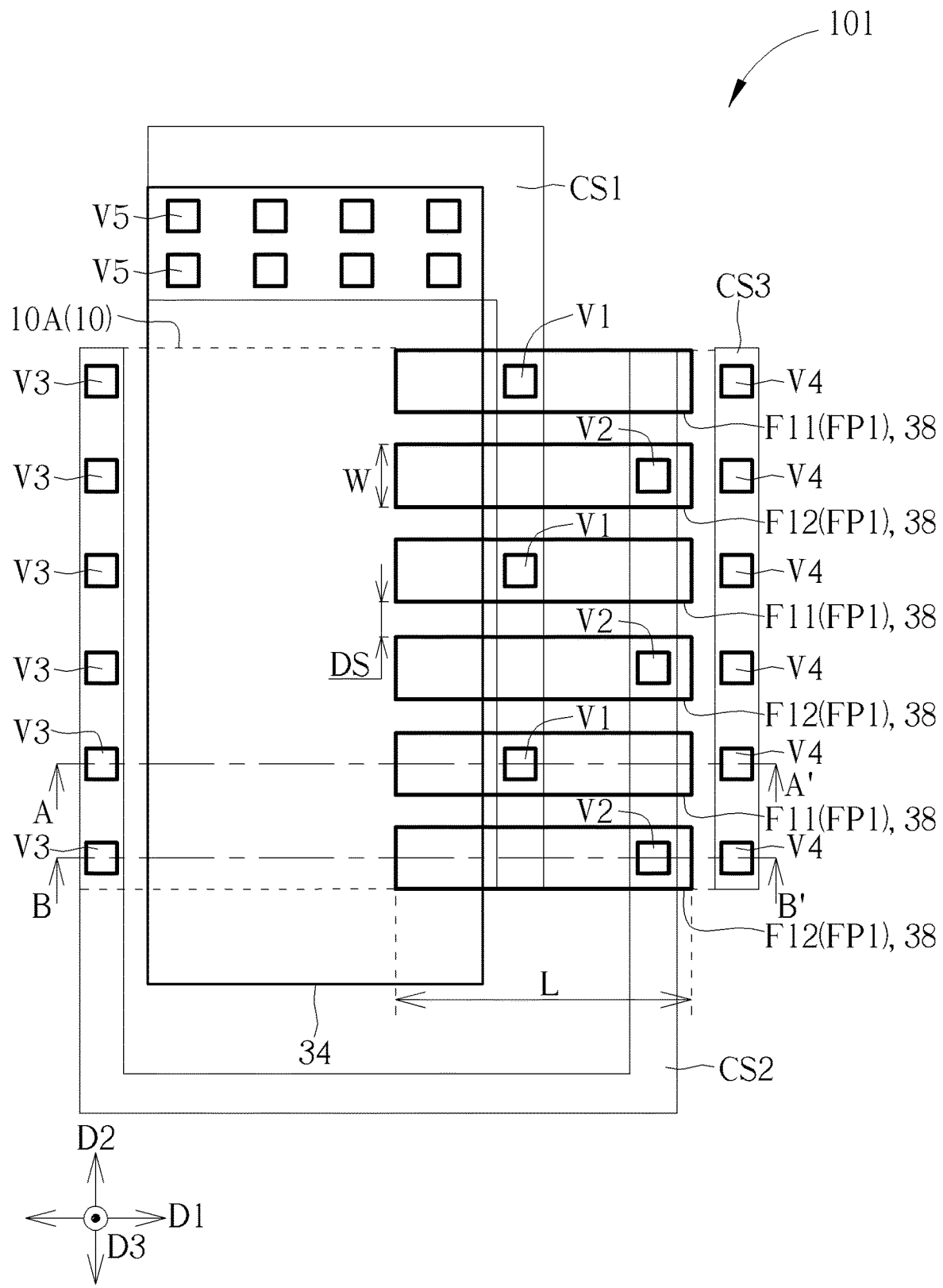
FIG. 1 is a schematic drawing illustrating a semiconductor device according to a first embodiment of the present invention.
Figure 2:
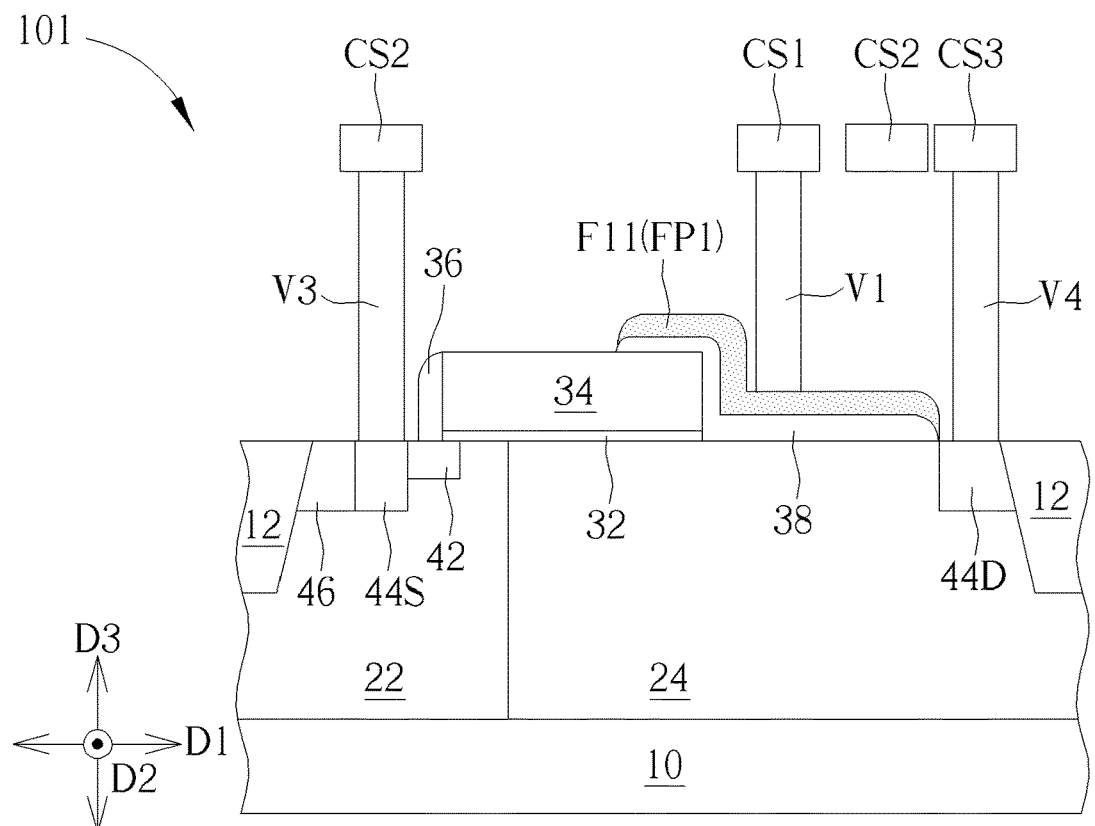
FIG. 2 is a schematic cross-sectional diagram of the semiconductor device according to the first embodiment of the present invention.
Figure 3:
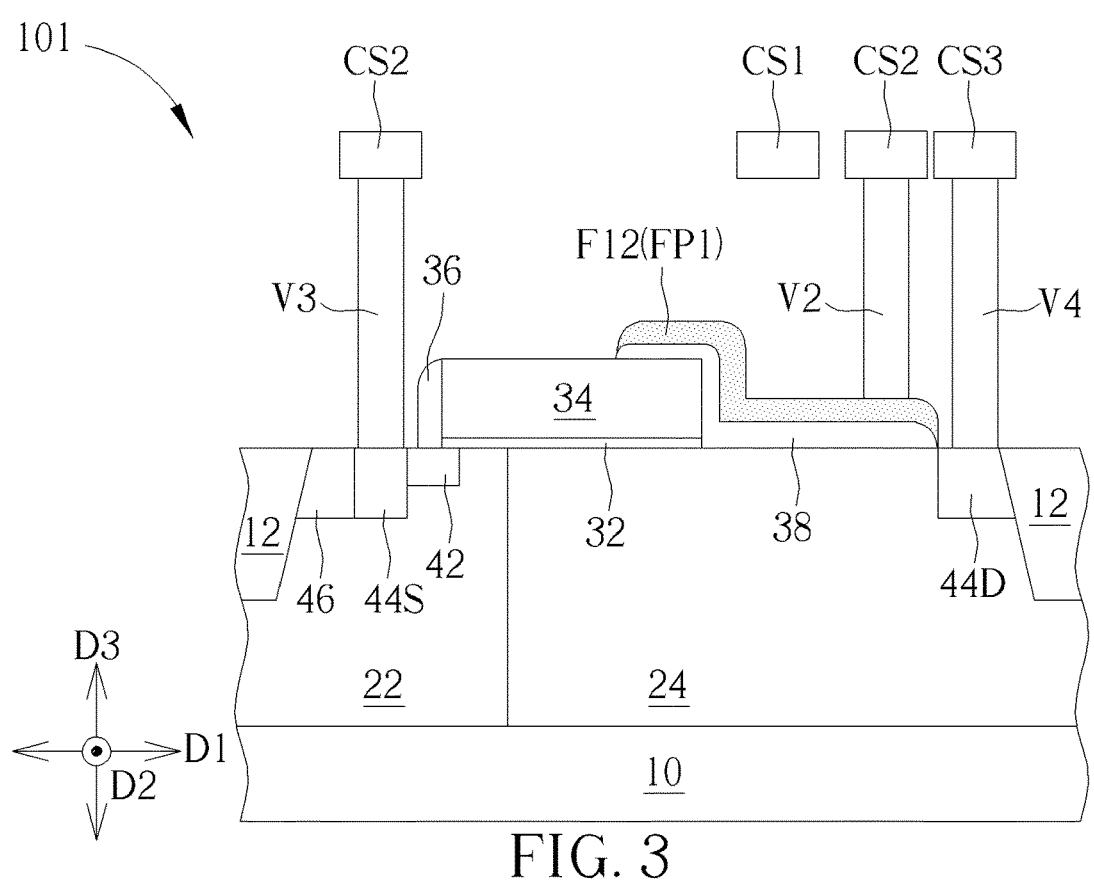
FIG. 3 is another schematic cross-sectional diagram of the semiconductor device according to the first embodiment of the present invention.

Please refer to FIGS. 1-3. FIG. 1 is a schematic drawing illustrating a semiconductor device 101 according to a first embodiment of the present invention, FIG. 2 is a schematic cross-sectional diagram of the semiconductor device 101 in this embodiment, and FIG. 3 is another schematic cross-sectional diagram of the semiconductor device 101 in this embodiment of the present invention. Additionally, FIG. 1 may be regarded as a top view diagram of the semiconductor device 101 and/or a schematic layout diagram of the semiconductor device 101, and some parts in the semiconductor device 101 (such as a source region, a drain region, a doped region, well regions, an isolation structure, a spacer, a gate dielectric layer, and so forth) are not illustrated in FIG. 1. FIG. 2 may be regarded as a cross-sectional diagram taken along a line A-A' in FIG. 1, and FIG. 3 may be regarded as a cross-sectional diagram taken along a line B-B' in FIG. 1, but not limited thereto. A shown in FIGS. 1-3, the semiconductor device 101 includes a semiconductor substrate 10, a gate structure 34, a source region 44S, a drain region 44D, and a plurality of field plates (such as a plurality of first field plates FP1). The gate structure 34 is disposed on the semiconductor substrate 10. The source region 44S and the drain region 44D are disposed in the semiconductor substrate 10 and located at two opposite sides of the gate structure 34 in a first direction D1 respectively. The first field plates FP1 are disposed on the semiconductor substrate 10. Each of the first field plates FP1 is partly located above the gate structure 34 and partly located between the gate structure 34 and the drain region 44D. The gate structure 34 is electrically connected with at least one of the first field plates FP1, and the source region 44S is electrically connected with at least one of the first field plates FP1. The properties of the semiconductor device 101, such as the on-resistance (Ron), the gate charge (Qg), and so on, may be adjusted by making at least one of the first field plates FP1 electrically connected with the gate structure 34 and making at least one of the first field plates FP1 electrically connected with the source region 44S, and the effect of reducing power loss may be achieved accordingly.

In some embodiments, the first direction D1 described above may be regarded as a horizontal direction, and the first direction D1 may be substantially orthogonal to another horizontal direction (such as a second direction D2 shown in FIGS. 1-3) and a vertical direction (such as a third direction D3 shown in FIGS. 1-3). Additionally, the third direction D3 may be regarded as a thickness direction of the semiconductor substrate 10. The semiconductor substrate 10 may have a top surface and a bottom surface opposite to the top surface in the third direction D3, and the gate structure 34 and the first field plates FP1 may be disposed at a side of the top surface, but not limited thereto. The second direction D2 and the first direction D1 may be substantially parallel with the top surface of the semiconductor substrate 10 and/or the bottom surface of the semiconductor substrate 10, but not limited thereto. Additionally, in this description, a distance between the bottom surface of the semiconductor substrate 10 and a relatively higher location and/or a relatively higher part in the vertical direction (such as the third direction D3) is greater than a distance between the bottom surface of the semiconductor substrate 10 and a relatively lower location and/or a relatively lower part in the third direction D3. The bottom or a lower portion of each component may be closer to the bottom surface of the semiconductor substrate 10 in the third direction D3 than the top or upper portion of this component. Another component disposed above a specific component may be regarded as being relatively far from the bottom surface of the semiconductor substrate 10 in the third direction D3, and another component disposed under a specific component may be regarded as being relatively closer to the bottom surface of the semiconductor substrate 10 in the third direction D3.

Specifically, in some embodiments, the semiconductor device 101 may further include an isolation structure 12, a first well region 22, a second well region 24, a gate dielectric layer 32, a spacer 36, a plurality of insulation patterns 38, a lightly doped region 42, a doped region 46, a plurality of contact structures (such as a contact structure V1, a contact structure V2, a contact structure V3, a contact structure V4, and a contact structure V5), a first connection structure CS1, a second connection structure CS2, and a third connection structure CS3, but not limited thereto. The isolation structure 12 may be at least partially disposed in the semiconductor substrate 10 for defining a plurality of active regions 10A in the semiconductor substrate 10. The first well region 22 and the second well region 24 may be disposed in the semiconductor substrate 10. A part of the first well region 22 and a part of the second well region 24 may be located at two opposite sides of the gate structure 34 in the first direction D1, respectively. The source region 44S may be located in the first well region 22, and the drain region 44D may be located in the second well region 24. Additionally, the lightly doped region 42 and the doped region 46 may be disposed in the semiconductor substrate 10 and located in the first well region 22, and the source region 44S may be disposed adjacent to the lightly doped region 42 and the dope region 46 respectively.

In some embodiments, the conductivity type of the first well region 22 may be complementary to the conductivity type of the second well region 24. The conductivity type of source region 44S, the drain region 44D, and the lightly doped region 42 may be identical to that of the second well region 24, and the conductivity type of the doped region 46 may be identical to that of the first well region 22, but not limited thereto. For example, when the semiconductor substrate 10 is as p-type semiconductor substrate or a semiconductor substrate including a p-type doped region, the first well region 22 may be a p-type doped well region, the second well region 24 may be an n-type doped well region, the lightly doped region 42 may be an n-type lightly doped region, the source region 44S and the drain region 44D may be an n-type heavily doped region respectively, and the doped region 46 may be a p-type heavily doped region, but not limited thereto. In some embodiments, the doped region 46 may be used to control the electric potential of the first well region 22, and the doped region 46 and the source region 44S may be regarded as a source doped region of the semiconductor device 101, but not limited thereto. Additionally, in some embodiments, the second well region 24 may be regarded as a drift region in the semiconductor device, and the semiconductor device may be regarded as a double-diffused MOS (DMOS) device, such as a DMOS device in a Bipolar-CMOS-DMOS (BCD) structure, but not limited thereto.

The gate dielectric layer 32 is disposed on the semiconductor substrate 10, and at least a part of the gate dielectric layer 32 may be located between the gate structure 34 and the semiconductor substrate 10 in the third direction D3. The spacer 36 is disposed on the semiconductor substrate 10, and the spacer 36 may be disposed on the sidewall of the gate structure 34 and located above the lightly doped region 38 in the third direction D3, but not limited thereto. The insulation patterns 38 may be disposed on the semiconductor substrate 10, each of the insulation patterns 38 may be partly located above the gate structure 34 and partly located between the gate structure 34 and the drain region 44D, and each of the insulation patterns 38 may be disposed between one of the first field plates FP1 and the semiconductor substrate 10. In some embodiments, each of the insulation patterns 38 and the corresponding first field plate FP1 may be disposed corresponding to each other in the third direction D3. A projection pattern of each of the insulation patterns 38 in the third direction D3 and a projection pattern of the corresponding first field plate FP1 in the third direction D3 may overlap each other and have the same pattern shape and area, but not limited thereto.

In addition, the contact structures V1, the contact structures V2, the contact structures V3, the contact structures V4, and the contact structures V5 may be disposed in an interlay dielectric layer (not shown) covering the first field plates FP1, the source region 44S, the drain region 44D, and the gate structure 34. The contact structures V1 and the contact structures V2 may be disposed on and electrically connected with the corresponding first field plates FP1, the contact structures V3 may be disposed on and electrically connected with the source region 44S, the contact structures V4 may be disposed on and electrically connected with the drain region 44D, and the contact structures V5 may be disposed on and electrically connected with the gate structure 34. In some embodiments, each of the contact structures described above may directly contact the corresponding component for forming the electrical connection, or an electrical conduction auxiliary structure (such as electrically conductive metal silicide) may be formed between each contact structure and the corresponding component according to some design considerations for reducing the contact resistance, but not limited thereto.

In some embodiments, the first connection structure CS1, the second connection structure CS2, and the third connection structure CS3 may be disposed on the interlay dielectric layer described above. The first connection structure CS1, the second connection structure CS2, and the third connection structure CS3 may be disposed separated from one another (such as being electrically separated from one another and/or without directly connected with one another). The first connection structure CS1, the second connection structure CS2, and the third connection structure CS3 may be connected with the corresponding contact structures for being electrically connected with the corresponding contact structures, respectively. For example, the gate structure 34 may be electrically connected with at least one of the first field plates FP1 via the contact structure V5, the first connection structure CS1, and the contact structure V1; the source region 44S may be electrically connected with at least one of the first field plates FP1 via the contact structure V3, the second connection structure CS2, and the contact structure V2; and the third connection structure CS3 may be electrically connected with the drain region 44D via the contact structure V4.

In some embodiments, each of the first field plates FP1 may be elongated in the first direction D1, the first field plates FP1 may be repeatedly arranged in the second direction D2, the first field plates FP1 may be separated from one another, and the gate structure 34 may be substantially elongated in the second direction D2, but not limited thereto.

Additionally, in some embodiments, the first field plate FP1 electrically connected with the gate structure 34 may be electrically separated from the first field plate FP1 electrically connected with the source region 44S. For example, the first field plate FP1 electrically connected with the gate structure 34 may be regarded as a field plate F11, the first field plate FP1 electrically connected with the source region 44S may be regarded as a field plate F12, and the field plate F11 is electrically separated from the field plate F12. In some embodiments, the gate structure 34 may be electrically connected with more than one of the first field plates FP1 (such as a plurality of the field plates F11), the source region 44S may be electrically connected with more than one of the first field plates FP1 (such as a plurality of the field plates F12), and the field plates F11 are electrically separated from the field plates F12. In some embodiments, each field plate F11 in the first field plates FP1 may be electrically connected with the gate structure 34 via the contact structure V1, the first connection structure CS1, and the contact structure V5, and each field plate F12 in the first field plates FP1 may be electrically connected with the source region 44S via the contact structure V2, the second connection structure CS2, and the contact structure V3. In addition, the first connection structure CS1 may overlap a part of the first field plate FP1 electrically connected with the source region 44S (such as the field plate F12) in a thickness direction of the semiconductor substrate 10 (such as the third direction D3) and the first connection structure CS1 may be electrically separated from the field plate F12; and the second connection structure CS2 may overlap a part of the first field plate FP1 electrically connected with the gate structure 34 (such as the field plate F11) in the third direction D3 and the second connection structure CS2 may be electrically separated from the field plate F11, but not limited thereto. In other words, when the semiconductor device 101 is viewed in the third direction D3, the first connection structure CS1 and the field plates F12 may overlap one another and be electrically separated from one another, and the second connection structure CS2 and the field plates F11 may overlap one another and be electrically separated from one another, but not limited thereto.

In some embodiments, the field plate F11 electrically connected with the gate structure 34 may be used to increase the accumulated charge for reducing the on-resistance of the semiconductor device 101 and improving the electrical safe operating area (E-SOA), and the field plate F12 electrically connected with the source region 44S may be used to improve the gate-to-drain capacitance (Cgd) for reducing the gate charge of the semiconductor device 101 and improving the figure of merit (FOM) of the semiconductor device 101. Therefore, the number of the first field plates FP1, the arrangement density of the first field plates FP1 (such as a distance DS between two adjacent first field plates FP1 in the second direction D2), and/or the dimension (or the size) of the first field plate FP1 (such as a width W and/or a length L of each of the first field plates FP1) may be adjusted for controlling the effect generated by the first field plates FP1 in the semiconductor device 101. In some embodiments, the first field plates FP1 may have substantially the same dimension (such as substantially the same width W and/or the same length L), and the first field plates FP1 may be repeatedly arranged by the same pitch in the second direction D2 and aligned with one another. Under the design described above, the degree of contribution of the field plates F11 electrically connected with the gate structure 34 and the field plates F12 electrically connected with the source region 44S to the properties of the semiconductor device may be controlled by adjusting the numbers and/or the locations of the first contact structures V1 and the second contact structures V2 without changing the layout design of the first field plates FP1 for simplifying the design procedure and/or reducing the manufacturing cost, but not limited thereto.

In addition, the power loss of the semiconductor device may include conduction loss, switching loss and drive loss, wherein the switching loss will be affected by the on-resistance and gate charge at the same time, the drive loss will be affected by the gate charge, and the conduction loss will be affected by the on-resistance. Under an operation with relatively lower switching frequency, the power loss of semiconductor devices mainly comes from the conduction loss. Under an operation with relatively higher switching frequency, the ratio of the drive loss and the switching loss in the overall power loss will gradually increase with increasing frequency. In some embodiments, although the field plate F11 electrically connected to the gate structure 34 can be used to reduce the on-resistance, it will also increase the gate charge and worsen the drive loss and the switching loss, and although the field plate F12 electrically connected to the source region 44S can be used to reduce the gate charge, it will also increase the on-resistance and worsen the conduction loss and the switching loss. Therefore, the number, the arrangement density, and/or the dimension of the field plates F11 electrically connected with the gate structure 34 and the field plates F12 electrically connected with the source region 44S may be adjusted according to the product requirements of the semiconductor device (such as the requirements of different characteristics and/or the requirements of operating switching frequency), and the semiconductor device may meet the specification requirements accordingly.

For example, for the operation with relatively lower switching frequency and/or the condition where the E-SOA is more important, the number, the arrangement density, and/or the dimension of the field plates F11 electrically connected with the gate structure 34 may be increased; for the operation with relatively higher switching frequency and/or the condition where the FOM is more important, the number, the arrangement density, and/or the dimension of the field plates F12 electrically connected with the source region 44S may be increased; and for the operation with relatively medium switching frequency, the number, the arrangement density, and/or the dimension of the field plates F11 electrically connected with the gate structure 34 may be substantially equal to or similar to that of the field plates F12 electrically connected with the source region 44S, but not limited thereto. Therefore, the number of the field plates F11 electrically connected with the gate structure 34 may be equal to or different from the number of the field plates F12 electrically connected with the source region 44S, and the dimension of the field plate F11 electrically connected with the gate structure 34 may be identical to or different from the dimension of the field plate F12 electrically connected with the source region 44S. In some embodiments, the number of the field plates F11 electrically connected with the gate structure 34 may be equal to the number of the field plates F12 electrically connected with the source region 44S, and the field plates F11 electrically connected with the gate structure 34 and the field plates F12 electrically connected with the source region 44S may be alternately arranged in the second direction D2 for making the effect generated by the field plates F11 and the effect generated by the field plates F12 uniformly distributed in the semiconductor device.

In some embodiments, the semiconductor substrate 10 may include a silicon substrate, an epitaxial silicon substrate, a silicon germanium substrate, a silicon carbide substrate, a silicon-on-insulator (SOI) substrate, or a substrate formed of other suitable semiconductor materials and/or other suitable structures. In some embodiments, the first well region 22, the second well region 24, the lightly doped region 42, the drain region 44D, the source region 44S, and the doped region 46 may include doped regions formed by doping processes (such as implantation processes) in the semiconductor substrate 10. In other words, the first well region 22, the second well region 24, the lightly doped region 42, the drain region 44D, the source region 44S, and the doped region 46 may include a part of the semiconductor substrate 10 (i.e. having the same material with the semiconductor substrate 10) respectively and dopants formed in the semiconductor substrate 10. In addition, the isolation structure 12 may include a single layer or multiple layers of insulation materials, such as oxide insulation materials or other suitable insulation materials. The gate dielectric layer 32 may include high dielectric constant (high-k) materials or other suitable dielectric materials (such as silicon oxide). The gate structure 34 may include non-metallic electrically conductive materials (such as doped polysilicon) or metal electrically conductive materials, such as a metal gate structure formed with a work function layer and a low electrical resistance layer stacked with each other, but not limited thereto. The spacer 36 may include a single layer or multiple layers of dielectric materials, such as silicon oxide, silicon nitride, silicon oxynitride, or other suitable dielectric materials. The insulation pattern 38 may include an oxide insulation material (such as silicon oxide) or other suitable insulation materials, and the first field plate FP1 may include non-metallic electrically conductive materials (such as doped polysilicon) or metal electrically conductive materials. Additionally, the first connection structure CS1, the second connection structure CS2, the third connection structure CS3, the contact structure V1, the contact structure V2, the contact structure V3, the contact structure V4, and the contact structure V5 may include a barrier layer (not shown) and an electrically conductive material (not shown) located on the barrier layer, respectively, but not limited thereto. The barrier layer described above may include titanium nitride, tantalum nitride, or other suitable barrier materials, and the electrically conductive material described above may include a material having relatively lower electrical resistivity, such as tungsten, aluminum, copper, titanium aluminide, and titanium, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 4:
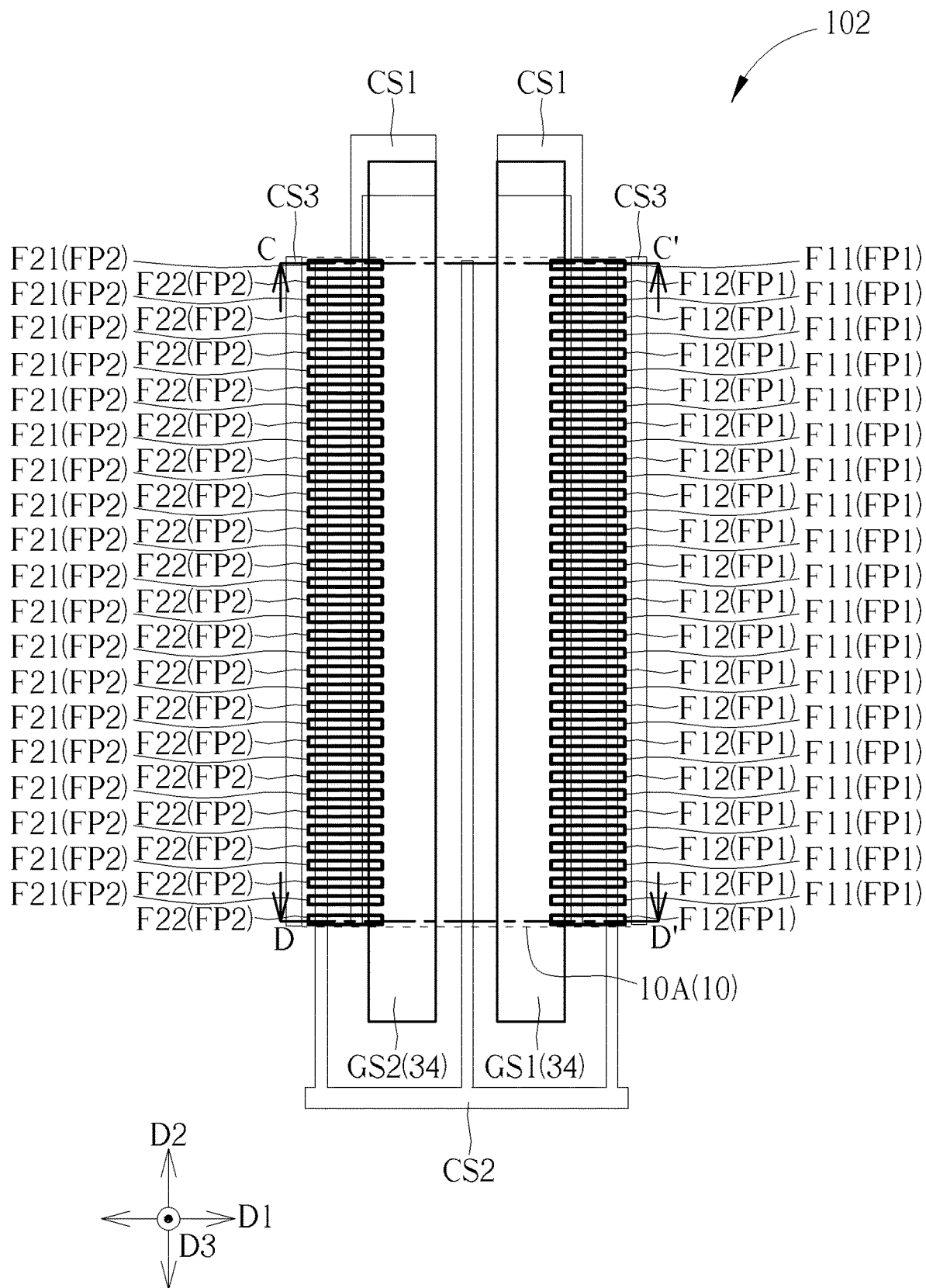
FIG. 4 is a schematic drawing illustrating a semiconductor device according to a second embodiment of the present invention.
Figure 5:
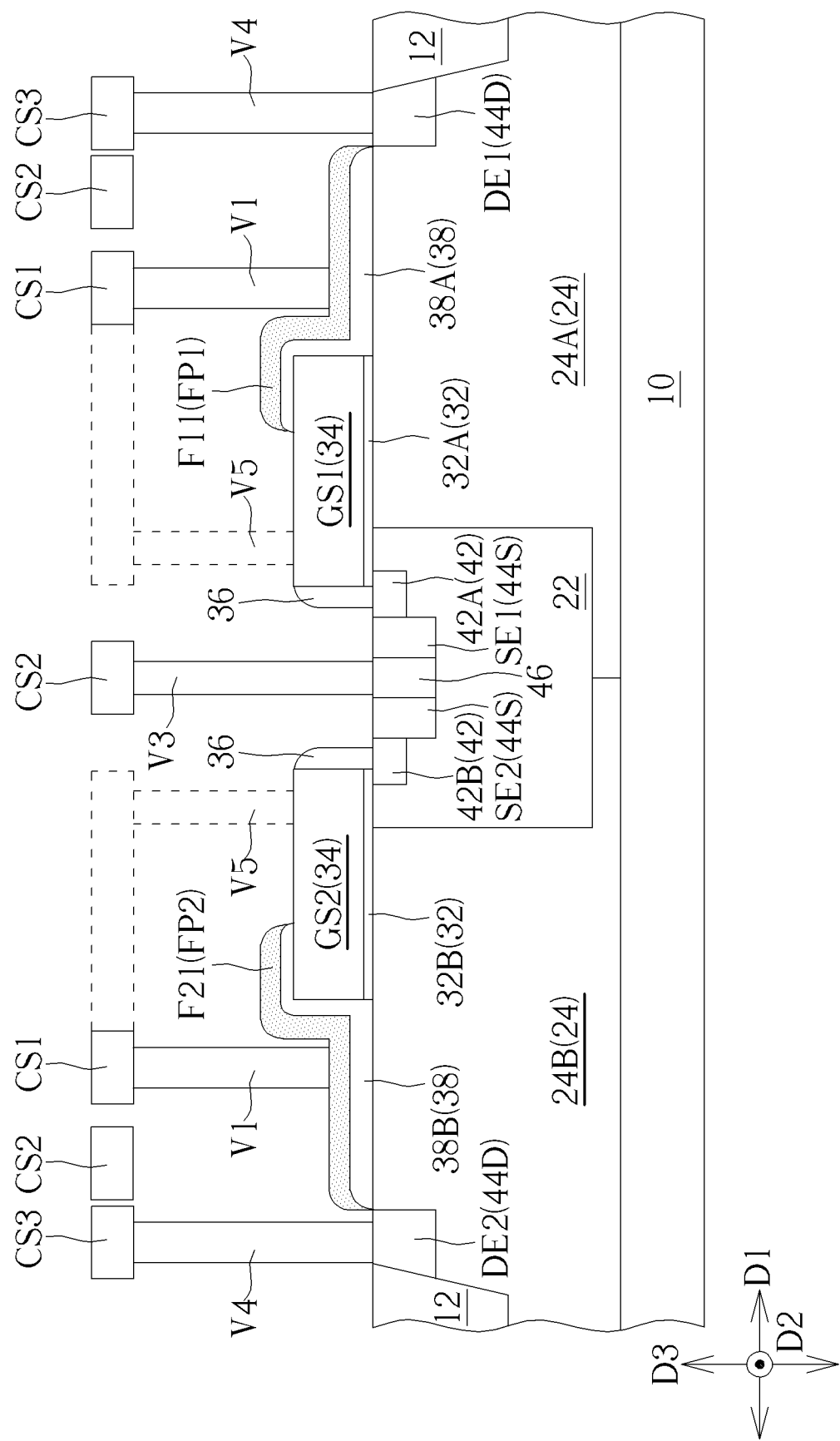
FIG. 5 is a schematic cross-sectional diagram of the semiconductor device according to the second embodiment of the present invention.
Figure 6:
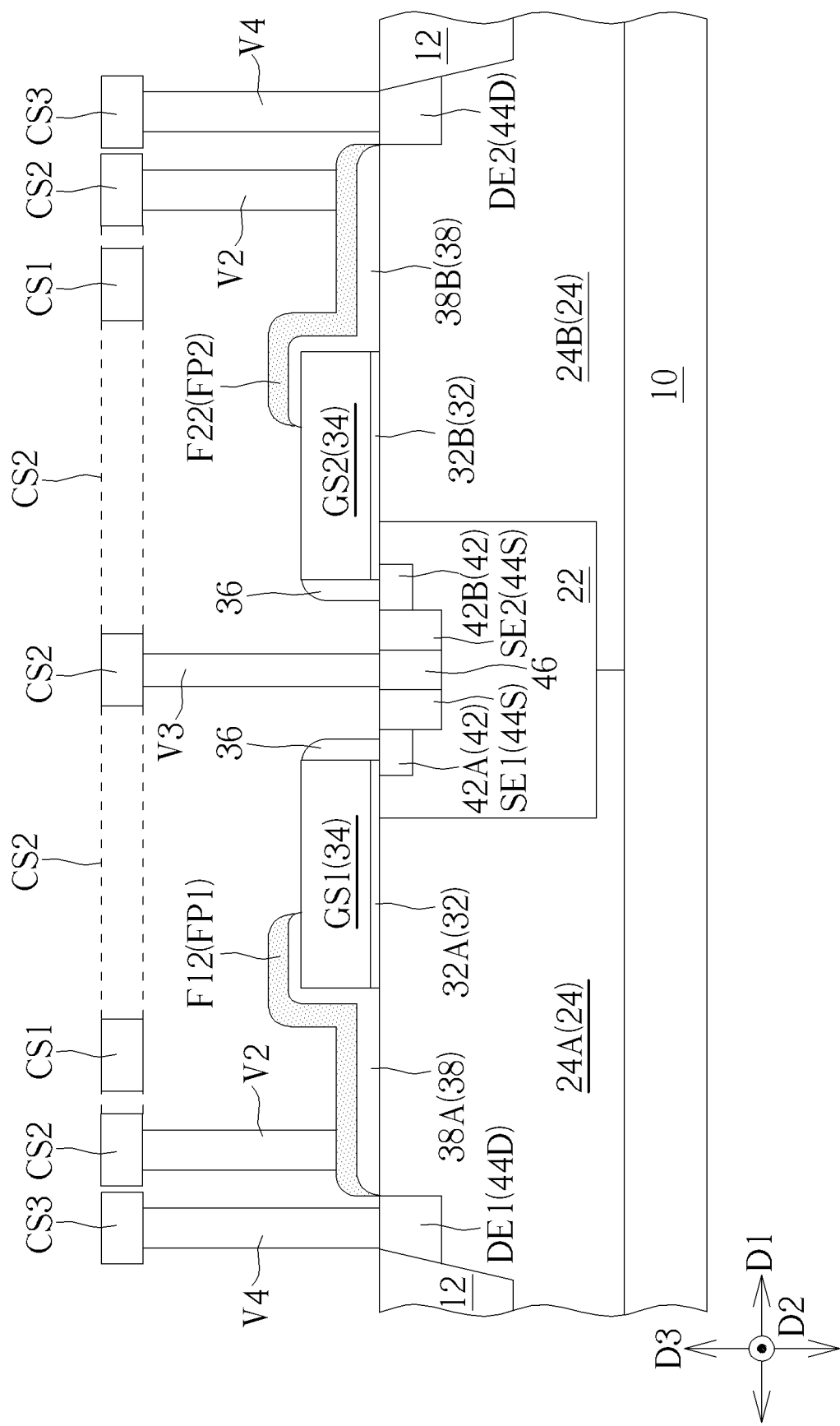
FIG. 6 is another schematic cross-sectional diagram of the semiconductor device according to the second embodiment of the present invention.

Please refer to FIGS. 4-6. FIG. 4 is a schematic drawing illustrating a semiconductor device 102 according to a second embodiment of the present invention, FIG. 5 is a schematic cross-sectional diagram of the semiconductor device 102 in this embodiment, and FIG. 6 is another schematic cross-sectional diagram of the semiconductor device 102 in this embodiment. Additionally, FIG. 4 may be regarded as a top view diagram of the semiconductor device 102 and/or a schematic layout diagram of the semiconductor device 102, and some parts in the semiconductor device 102

(such as the source region, the drain region, the doped region, the well regions, the isolation structure, the spacer, the gate dielectric layer, and so forth) are not illustrated in FIG. 4. FIG. 5 may be regarded as a cross-sectional diagram taken along a line C-C' in FIG. 4, and FIG. 6 may be regarded as a cross-sectional diagram taken along a line D-D' in FIG. 4, but not limited thereto. As shown in FIGS. 4-6, the semiconductor device 102 includes the semiconductor substrate 10, a first gate structure GS1, a second gate structure GS2, a first source region SE1, a first drain region DE1, a second source region SE2, a second drain region DE2, a plurality of the first field plates FP1, and a plurality of second field plates FP2. The first gate structure GS1 and the second gate structure GS2 are disposed on the semiconductor substrate 10. The first source region SE1 and the first drain region DE1 are disposed in the semiconductor substrate 10 and located at two opposite sides of the first gate structure GS1 in the first direction D1 respectively. The second source region SE2 and the second drain region DE2 are disposed in the semiconductor substrate 10 and located at two opposite sides of the second gate structure GS2 in the first direction D1 respectively. The first field plates FP1 and the second field plates FP2 are disposed on the semiconductor substrate 10. Each of the first field plates FP1 is partly located above the first gate structure GS1 and partly located between the first gate structure GS1 and the first drain region DE1, and the first gate structure GS1 is electrically connected with at least one of the first field plates FP1. Each of the second field plates FP2 is partly located above the second gate structure GS2 and partly located between the second gate structure GS2 and the second drain region DE2, and the second source region SE2 is electrically connected with at least one of the second field plates FP2.

In some embodiments, the semiconductor device 102 may be formed with two semiconductor devices in the first embodiment described above disposed with having mirror symmetry substantially, but not limited thereto. In some embodiments, the semiconductor device 102 may further include the isolation structure 12, the first well region 22, the second well region 24, a first gate dielectric layer 32A, a second gate dielectric layer 32B, the spacer 36, a plurality of first insulation patterns 38A, a plurality of second insulation patterns 38B, a first lightly doped region 42A, a second lightly doped region 42B, the doped region 46, a plurality of contact structures (such as the contact structure V1, the contact structure V2, the contact structure V3, the contact structure V4, and the contact structure V5 described above), two first connection structures CS1, the second connection structure CS2, and two third connection structures CS3, but not limited thereto. The isolation structure 12, the first well region 22, the second well region 24, the first lightly doped region 42A, the second lightly doped region 42B, and the doped region 46 are disposed in the semiconductor substrate 10. The first gate dielectric layer 32A, the second gate dielectric layer 32B, the spacer 36, the first insulation patterns 38A, the second insulation patterns 38B, the contact structures, and the connection structures are disposed on the semiconductor substrate 10.

A part of the first well region 22 and a first portion 24A of the second well region 24 may be located at two opposite sides of the first gate structure GS1 in the first direction D1, and a part of the first well region 22 and a second portion 24B of the second well region 24 may be located at two opposite sides of the second gate structure GS2 in the first direction D1. The doped region 46, the first source region SE1, the second source region SE2, the first lightly doped region 42A, and the second lightly doped region 42B may be located in the first well region 22. The first portion 24A and the second portion 24B of the second well region 24 may be at least partially disposed at two opposite sides of the first well region 22 in the first direction D1 respectively, and the first drain region DE1 and the second drain region DE2 may be located in the first portion 24A and the second portion 24B respectively. In some embodiments, when the semiconductor device 102 is viewed in the third direction D3, the first gate structure GS1 and the second gate structure GS2 may be elongated in the second direction D2 respectively and disposed parallel with each other. The doped region 46, the first source region SE1, and the second source region SE2 may be located between the first gate structure GS1 and the second gate structure GS2 in the first direction D1, and the doped region 46 may be located between the first source region SE1 and the second source region SE2 in the first direction D1.

At least a portion of the first gate dielectric layer 32A may be located between the first gate structure GS1 and the semiconductor substrate 10 in the third direction D3, and at least a portion of the second gate dielectric layer 32A may be located between the second gate structure GS2 and the semiconductor substrate 10 in the third direction D3. A portion of the spacer 36 may be disposed on sidewalls of the first gate structure GS1 and located above the first lightly doped region 42A in the third direction D3, and another portion of the spacer 36 may be disposed on sidewalls of the second gate structure GS2 and located above the second lightly doped region 42B in the third direction D3, but not limited thereto. Each of the first insulation patterns 38A may be partly located above the first gate structure GS1 and partly located between the first gate structure GS1 and the first drain region DE1, and each of the first insulation patterns 38A may be disposed between the semiconductor substrate 10 and one of the first field plates FP1. Each of the second insulation patterns 38B may be partly located above the second gate structure GS2 and partly located between the second gate structure GS2 and the second drain region DE2, and each of the second insulation patterns 38B may be disposed between the semiconductor substrate 10 and one of the second field plates FP2.

Each of the first field plates FP1 may be elongated in the first direction D1, and the first field plates FP1 may be repeatedly arranged in the second direction D2. Each of the second field plates FP2 may be elongated in the first direction D1, and the second field plates FP2 may be repeatedly arranged in the second direction D2. In some embodiments, the first field plates FP1 and the second field plates FP2 may substantially include a mirror symmetry symmetrical about the doped region 46, the first insulation patterns 38A and the insulation patterns 38B may substantially include a mirror symmetry symmetrical about the doped region 46, the first gate structure GS1 and the second gate structure GS2 may substantially include a mirror symmetry symmetrical about the doped region 46, the first source region SE1 and the second source region SE2 may substantially include a mirror symmetry symmetrical about the doped region 46, and the first drain region DE1 and the second drain region DE2 may substantially include a mirror symmetry symmetrical about the doped region 46, but not limited thereto.

In addition, the contact structure V1, the contact structure V2, the contact structure V3, the contact structure V4, and the contact structure V5 may be disposed in an interlayer dielectric layer (not shown) covering the first field plates FP1, the second field plates FP2, the first source region SE1, the first drain region DE1, the second source region SE2, the second drain region DE2, the first gate structure GS1, and the second gate structure GS2. The contact structure V1 and the contact structure V2 may be disposed on the corresponding first field plate FP1 and the corresponding second field plate FP2 respectively for being electrically connected with the corresponding first field plate FP1 and the corresponding second field plate FP2 respectively. The contact structure V3 may be disposed on the first source region SE1 or the second source region SE2 for being electrically connected with the first source region SE1 or the second source region SE2. The contact structure V4 may be disposed on the first drain region DE1 or the second drain region DE2 for being electrically connected with the first drain region DE1 or the second drain region DE2. The contact structure V5 may be disposed on the first gate structure GS1 or the second gate structure GS2 for being electrically connected with the first gate structure GS1 or the second gate structure GS2. The first connection structures CS1, the second connection structure CS2, and the third connection structures CS3 may be disposed on the interlayer dielectric layer described above. The first connection structures CS1, the second connection structure CS2, and the third connection structures CS3 may be connected with the corresponding contact structures for being electrically connected with the corresponding contact structures.

Similar to the first embodiment described above, each of the first field plates FP1 may be electrically connected with the first gate structure GS1 or the first source region SE1, and each of the second field plates FP2 may be electrically connected with the second gate structure GS2 or the second source region SE2. For example, the first field plate FP1 electrically connected with the first gate structure GS1 may be regarded as the field plate F11, the first field plate FP1 electrically connected with the first source region SE1 may be regarded as the field plate F12, the second field plate FP2 electrically connected with the second gate structure GS2 may be regarded as a field plate F21, and the second field plate FP2 electrically connected with the second source region SE2 may be regarded as a field plate F22. In some embodiments, the field plate F11 may be electrically separated from the field plate F12, the field plate F21 may be electrically separated from the field plate F22, and the field plate F12 may be electrically connected with the field plate F22, but not limited thereto. In other words, the first source region SE1 may be electrically connected with at least one of the first field plates FP1, and the second gate structure GS2 may be electrically connected with at least one of the second field plates FP2. The first field plate FP1 electrically connected with the first gate structure GS1 (such as the field plate F11) may be electrically separated from the first field plate FP1 electrically connected with the first source region SE1 (such as the field plate F12), the second field plate FP2 electrically connected with the second gate structure GS2 (such as the field plate F21) may be electrically separated from the second field plate FP2 electrically connected with the second source region SE2 (such as the field plate F22), and the field plate F12 electrically connected with the first source region SE1 may be electrically connected with the field plate F22 electrically connected with the second source region SE2, but not limited thereto.

In some embodiments, the first gate structure GS1 may be electrically connected with at least one of the first field plates FP1 via the contact structure V5, the first connection structure CS1, and the contact structure V1; the first source region SE1 may be electrically connected with at least one of the first field plates FP1 via the contact structure V3, the second connection structure CS2, and the contact structure V2; the second gate structure GS2 may be electrically connected with at least one of the second field plates FP2 via the contact structure V5, the first connection structure CS1, and the contact structure V1; the second source region SE2 may be electrically connected with at least one of the second field plates FP2 via the contact structure V3, the second connection structure CS2, and the contact structure V2; and the third connection structure CS3 may be electrically connected with the first drain region DE1 or the second drain region DE2 via the contact structure V4, but not limited thereto. In some embodiments, all of the first field plates FP1 may be electrically connected with the first gate structure GS1 and all of the second field plates FP2 may be electrically connected with the second source region SE2 according to some design considerations.

In some embodiments, the first source region SE1 and the second source region SE2 may be electrically connected with each other. For example, the first source region SE1 may be electrically connected with the second source region SE2 via the doped region 46, the field plate F12 may be electrically connected with the field plate F22 via the doped region 46, and the doped region 46, the first source region SE1, and the second source region SE2 may be regarded as a common source structure, but not limited thereto. Additionally, the material composition of the first gate structure GS1 and the second gate structure GS2 may be identical to or similar to that of the gate structure 34 described above; the material composition of the first gate dielectric layer 32A and the second gate dielectric layer 32B may be identical to or similar to that of the gate dielectric layer 32 described above; the material composition of the first source region SE1, the second source region SE2, the first drain region DE1, and the second drain region DE2 may be identical to or similar to that of the source region 44S and the drain region 44D described above; the material composition of the second field plate FP2 may be identical to or similar to that of the first field plate FP1; and the material composition of the first insulation pattern 38A and the second insulation pattern 38B may be identical to or similar to that of the insulation pattern 38 described above, but not limited thereto.

Similar to the first embodiment described above, the numbers, the arrangement densities, and/or the dimensions of the first field plates FP1 and the second field plates FP2 may be adjusted for controlling the effect generated by the first field plates FP1 and the second field plates FP2 in the semiconductor device 102. In other words, according to some design considerations, the number of the first field plates FP1 may be equal to or different from the number of the second field plates FP2, the arrangement density of the first field plates FP1 may be equal to or different from the arrangement density of the second field plates FP2, or the dimension of the first field plate FP1 may be identical to or different from the dimension of the second field plate FP2. In addition, the numbers, the arrangement densities, and/or the dimensions of the field plates F11 electrically connected with the first gate structure GS1, the field plates F12 electrically connected with the first source region SE1, the field plates F21 electrically connected with the second gate structure GS2, and the field plates F22 electrically connected with the second source region SE2 may be adjusted according to the product requirements of the semiconductor device, and the semiconductor device may meet the specification requirements accordingly. In other words, the number, the arrangement density, and/or the dimension of the field plates F11 may be identical to or different from that of the field plates F12; and the number, the arrangement density, and/or the dimension of the field plates F21 may be identical to or different from that of the field plates F22.

In some embodiments, the number of the field plates F11 electrically connected with the first gate structure GS1 may be equal to the number of the field plates F12 electrically connected with the first source region SE1, the number of the field plates F21 electrically connected with the second gate structure GS2 may be equal to the number of the field plates F22 electrically connected with the second source region SE2, the field plates F11 and the field plates F12 may be alternately arranged in the second direction D2, and the field plates F21 and the field plates F22 may be alternately arranged in the second direction D2 for making the effects generated by the field plates F11, the field plates F12, the field plates F21, and the field plates F22 uniformly distributed in the semiconductor device.

Figure 7:
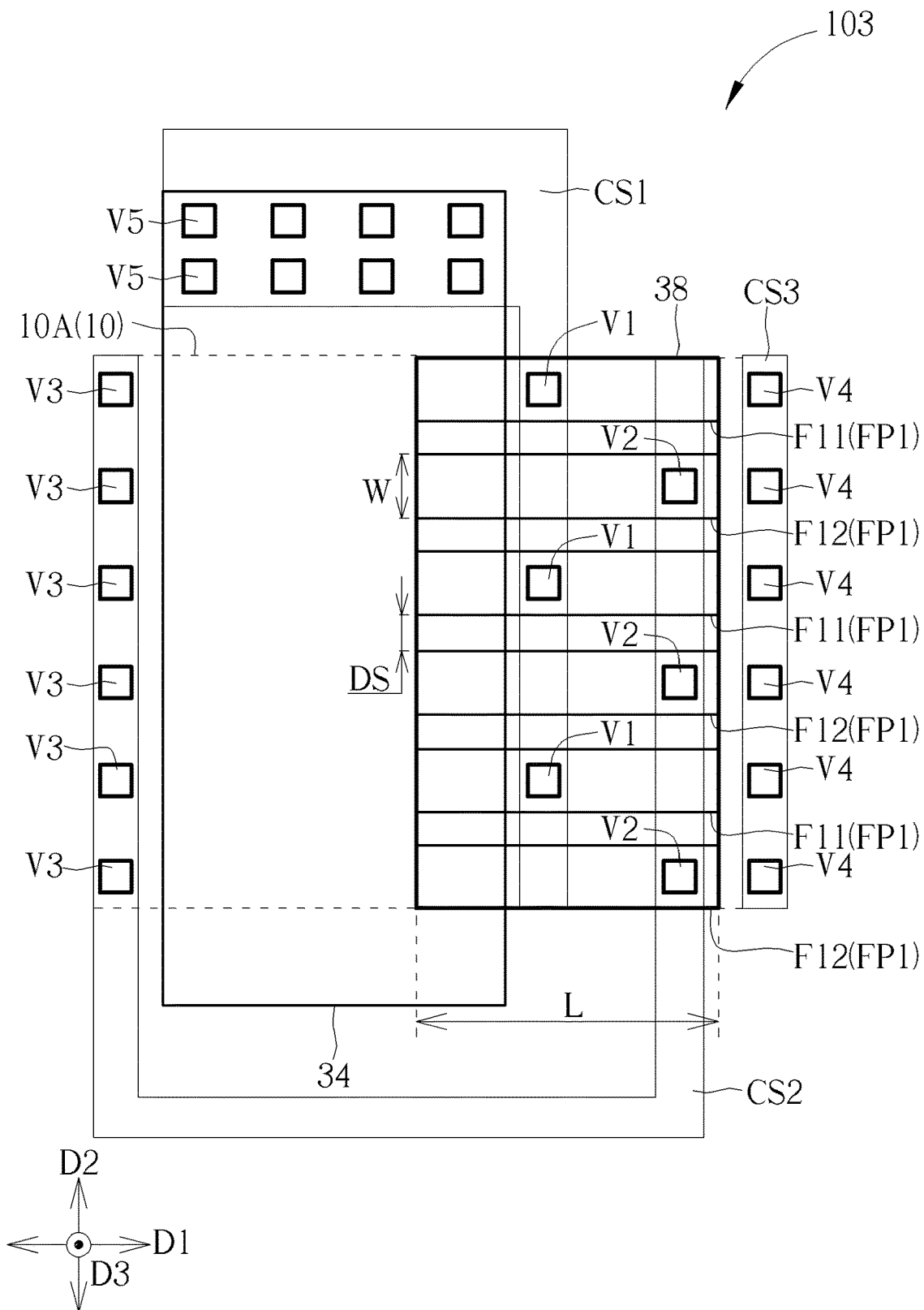
FIG. 7 is a schematic drawing illustrating a semiconductor device according to a third embodiment of the present invention.

Please refer to FIG. 7. FIG. 7 is a schematic drawing illustrating a semiconductor device 103 according to a third embodiment of the present invention. As shown in FIG. 7, the difference between this embodiment and the first embodiment described above is that the insulation pattern 38 in this embodiment may be disposed corresponding to more than one of the first field plates FP1, and the first field plates FP1 may be disposed on the same insulation pattern 38. The insulation pattern 38 located between the adjacent first field plates FP1 in the second direction D2 may be used to further adjust the influence of the first field plates FP1 on the electric field distribution and/or reduce the negative influence of the patterning process for forming the first field plates FP1 on the gate structure 34. In addition, the allocation of the insulation pattern 38 in this embodiment may also be applied to other embodiments of the present invention according to some design considerations. For example, in the second embodiment described above, the first field plates may be disposed on the same first insulation pattern and/or the second field plates may be disposed on the same second insulation pattern.

Figure 8:
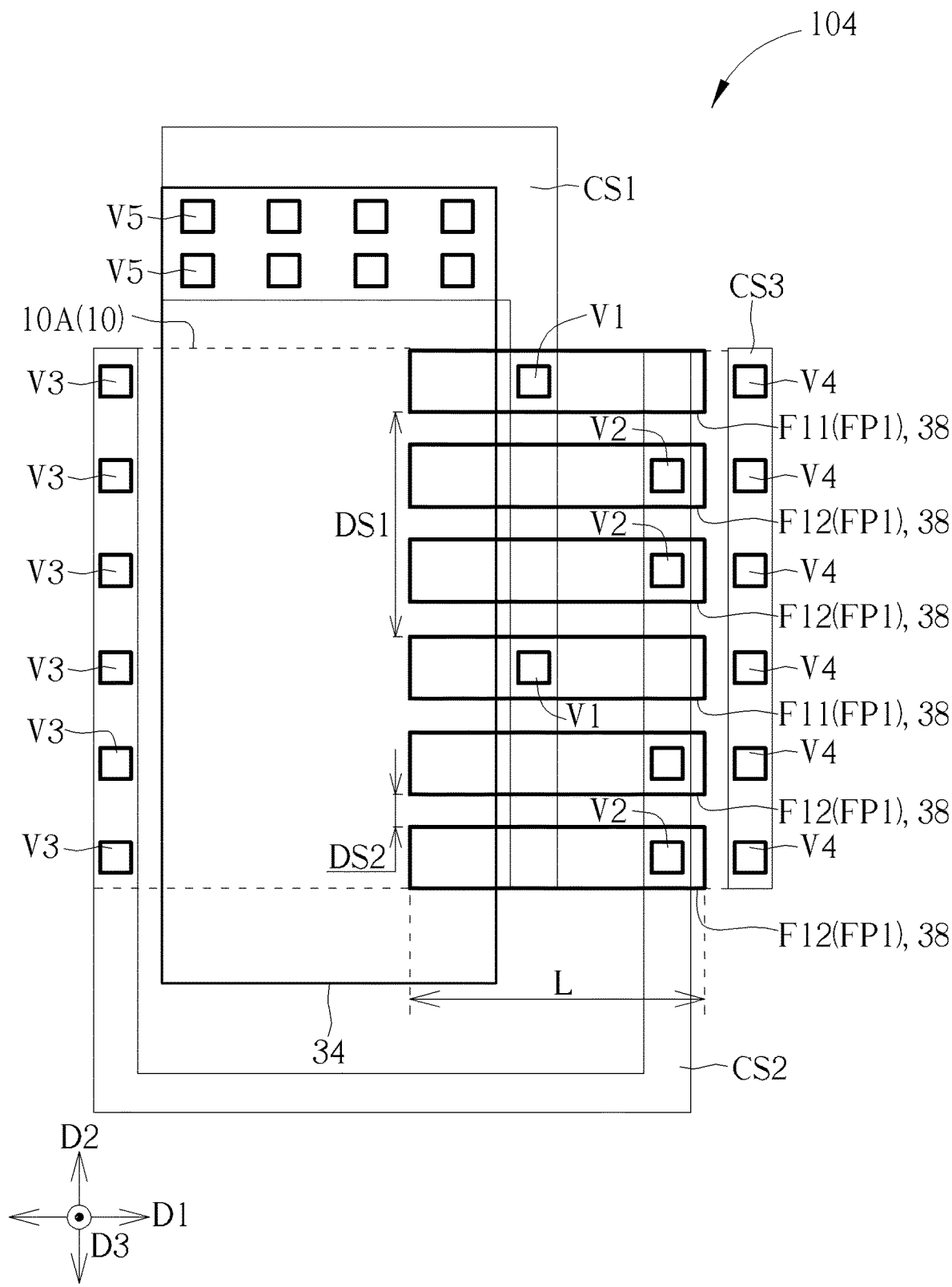
FIG. 8 is a schematic drawing illustrating a semiconductor device according to a fourth embodiment of the present invention.

Please refer to FIG. 8. FIG. 8 is a schematic drawing illustrating a semiconductor device 104 according to a fourth embodiment of the present invention. As shown in FIG. 8, in some embodiments, the number of the field plates F11 electrically connected with the gate structure 34 may be different from the number of the field plates F12 electrically connected with the source region, and the arrangement density of the field plates F11 electrically connected with the gate structure 34 may be different from the arrangement density of the field plates F12 electrically connected with the source region. Additionally, a minimum distance between two of the field plates F11 electrically connected with the gate structure 34 and adjacent to each other in the second direction D2 (such as a distance DS1 shown in FIG. 8) may be different from a minimum distance between two of the field plates F12 electrically connected with the source region and adjacent to each other in the second direction D2 (such as a distance DS2 shown in FIG. 8). For example, the number of the field plates F11 electrically connected with the gate structure 34 may be less than the number of the field plates F12 electrically connected with the source region, the arrangement density of the field plates F11 electrically connected with the gate structure 34 may be lower than the arrangement density of the field plates F12 electrically connected with the source region, and the minimum distance between two of the field plates F11 adjacent to each other in the second direction D2 may be greater than the minimum distance between two of the field plates F12 adjacent to each other in the second direction D2 for relatively increasing the influence of the field plates F12 electrically connected with the source region on the electrical properties of the semiconductor device.

Figure 9:
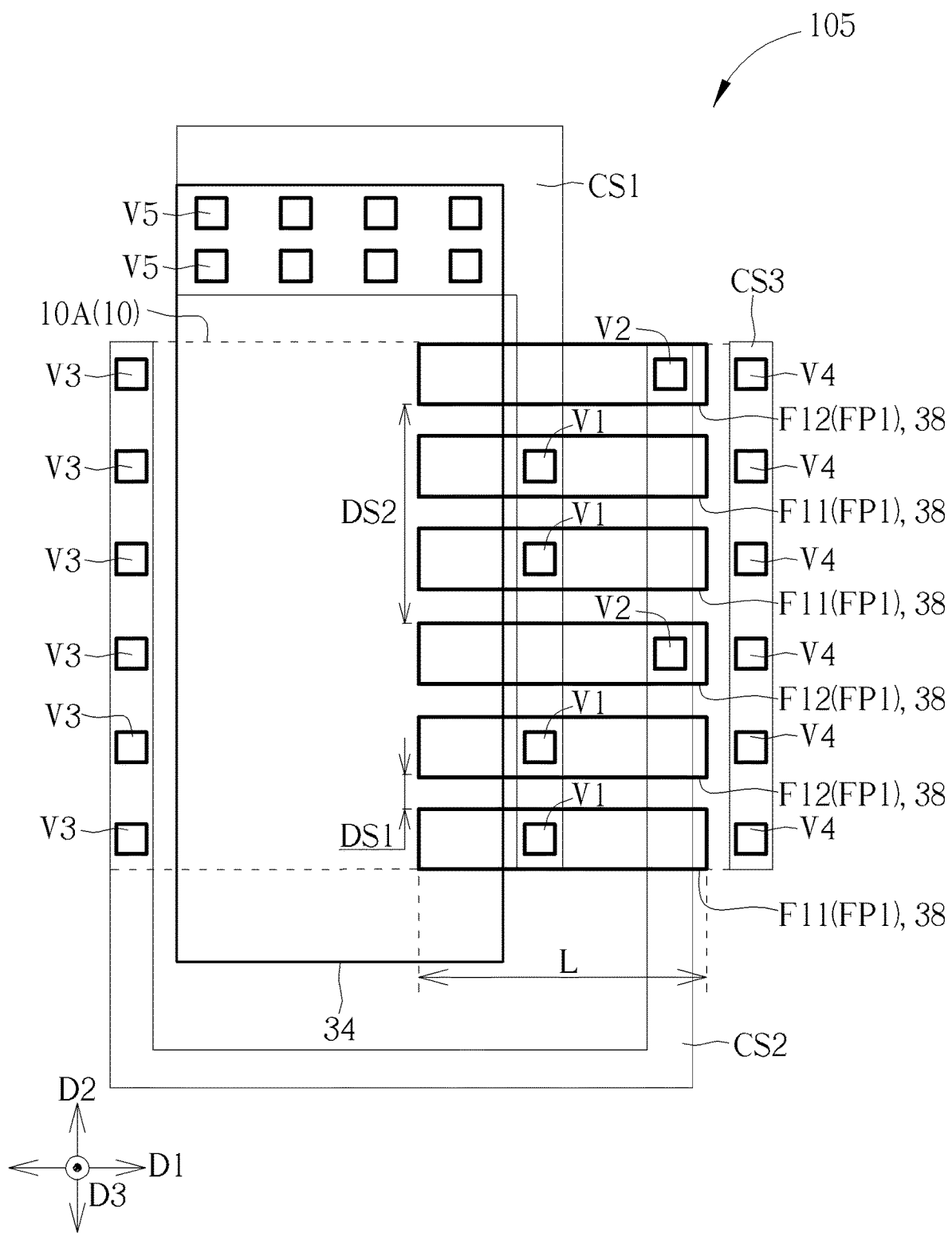
FIG. 9 is a schematic drawing illustrating a semiconductor device according to a fifth embodiment of the present invention.

Please refer to FIG. 9. FIG. 9 is a schematic drawing illustrating a semiconductor device 105 according to a fifth embodiment of the present invention. As shown in FIG. 9, in the semiconductor device 105, the number of the field plates F11 electrically connected with the gate structure 34 may be greater than the number of the field plates F12 electrically connected with the source region, the arrangement density of the field plates F11 electrically connected with the gate structure 34 may be higher than the arrangement density of the field plates F12 electrically connected with the source region, and the minimum distance between two of the field plates F11 adjacent to each other in the second direction D2 (such as the distance DS1) may be less than the minimum distance between two of the field plates F12 adjacent to each other in the second direction D2 (such as the distance DS2) for relatively increasing the influence of the field plates F11 electrically connected with the gate structure 34 on the electrical properties of the semiconductor device.

Figure 10:
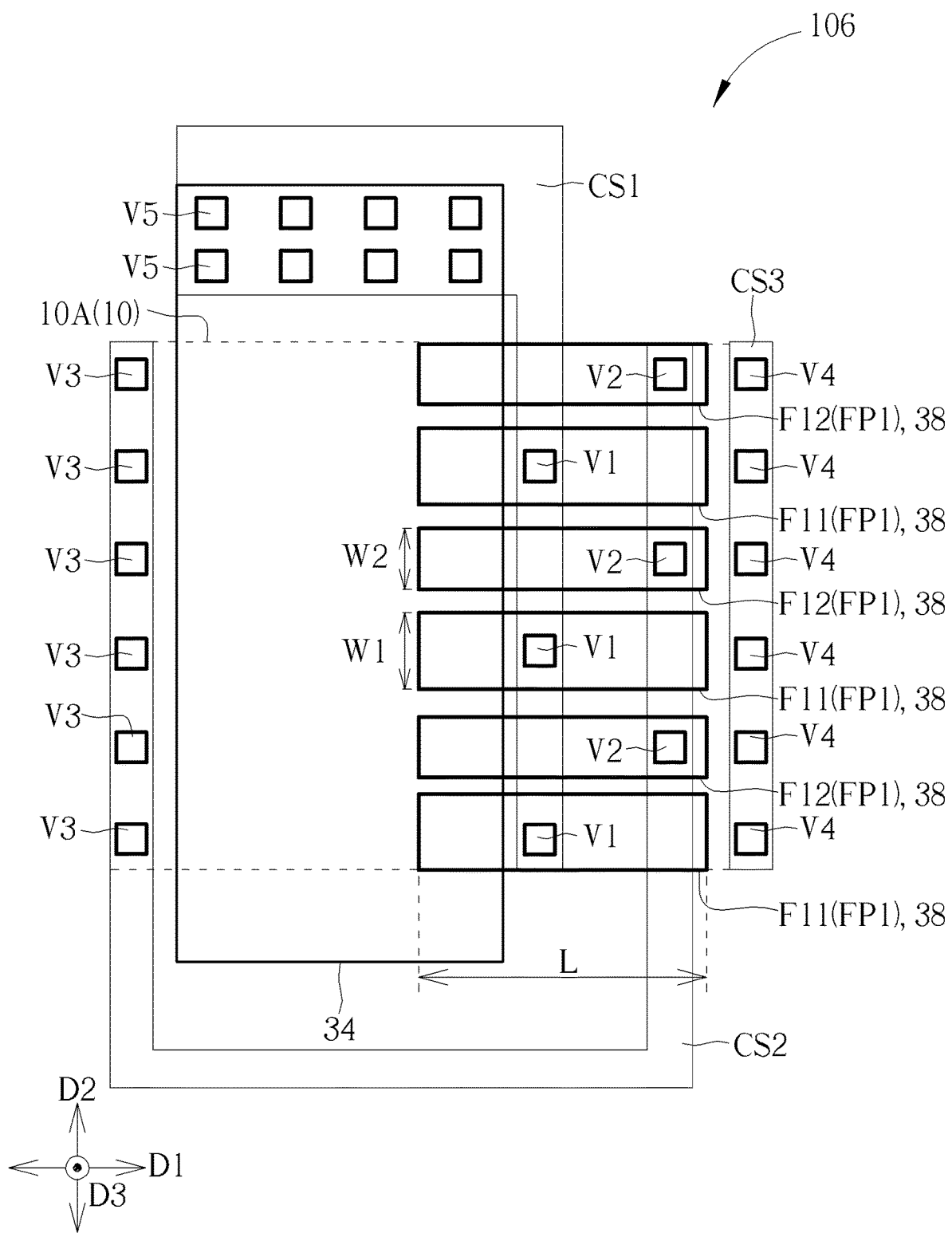
FIG. 10 is a schematic drawing illustrating a semiconductor device according to a sixth embodiment of the present invention.

Please refer to FIG. 10. FIG. 10 is a schematic drawing illustrating a semiconductor device 106 according to a sixth embodiment of the present invention. As shown in FIG. 10, in the semiconductor device 106, the dimension of the field plate F11 electrically connected with the gate structure 34 may be different from the dimension of the field plate F12 electrically connected with the source region, and a width W1 of the field plate F11 electrically connected with the gate structure 34 may be different from a width W2 of the field plate F12 electrically connected with the source region, for instance, but not limited thereto. For example, the width W1 of the field plate F11 electrically connected with the gate structure 34 may be greater than the width W2 of the field plate F12 electrically connected with the source region, and the length of the field plate F11 electrically connected with the gate structure 34 may be substantially equal to the length of the field plate F12 electrically connected with the source region for relatively increasing the influence of the field plates F11 electrically connected with the gate structure 34 on the electrical properties of the semiconductor device while the number of the field plates F11 is equal to the number of the field plates F12. Additionally, the width of the field plate described above may also be regarded as a length of the field plate in the second direction D2, but not limited thereto.

Figure 11:
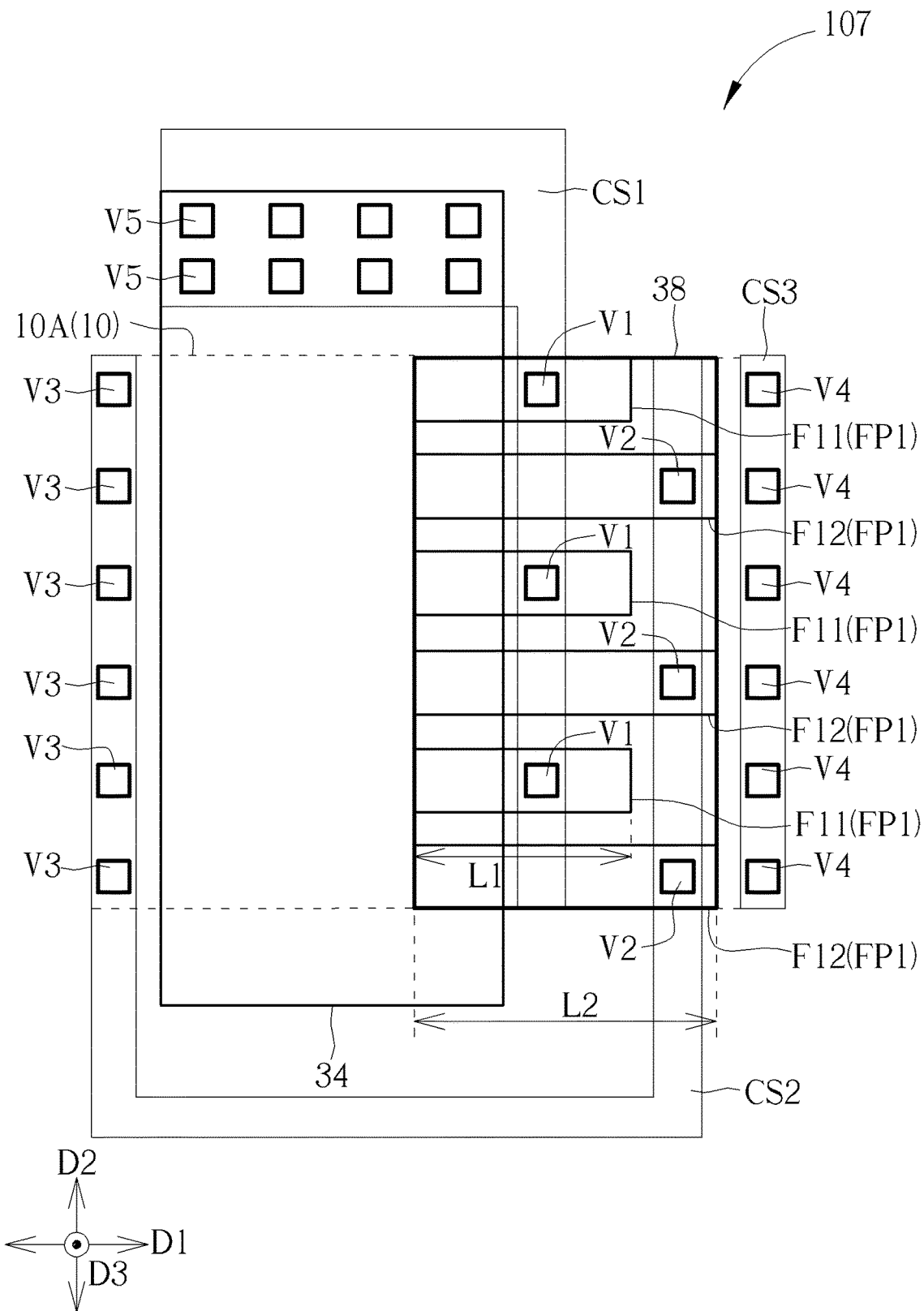
FIG. 11 is a schematic drawing illustrating a semiconductor device according to a seventh embodiment of the present invention.

Please refer to FIG. 11. FIG. 11 is a schematic drawing illustrating a semiconductor device 107 according to a seventh embodiment of the present invention. As shown in FIG. 11, in the semiconductor device 107, the dimension of the field plate F11 electrically connected with the gate structure 34 may be different from the dimension of the field plate F12 electrically connected with the source region, and a length L1 of the field plate F11 electrically connected with the gate structure 34 may be different from a length L2 of the field plate F12 electrically connected with the source region, for instance, but not limited thereto. For example, the length of the field plate F11 electrically connected with the gate structure 34 in the first direction D1 may be less than the length L2 of the field plate F12 electrically connected with the source region in the first direction D1 for relatively increasing the influence of the field plates F12 electrically connected with the source region on the electrical properties of the semiconductor device while the number of the field plates F11 is equal to the number of the field plates F12.

Figure 12:
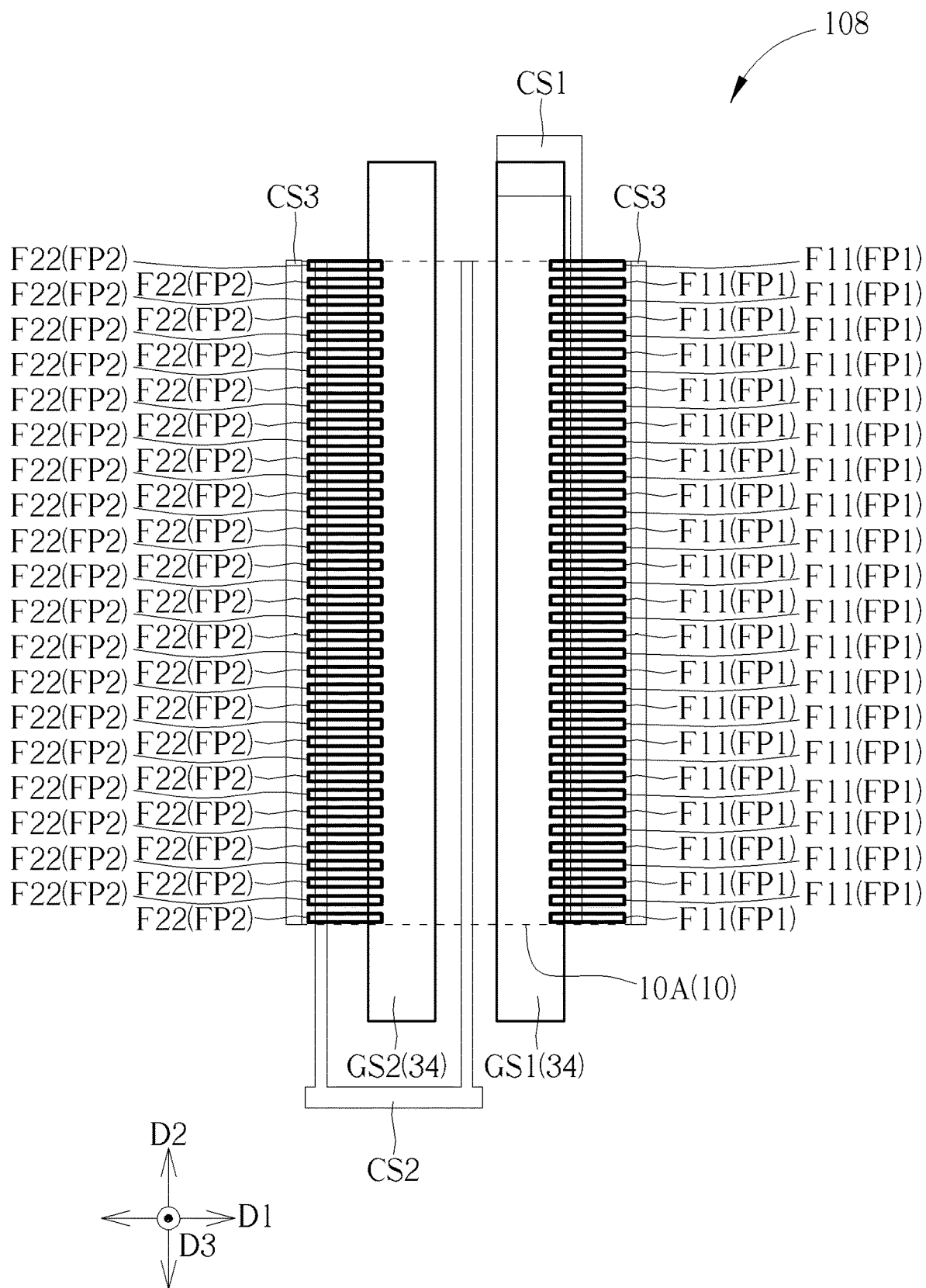
FIG. 12 is a schematic drawing illustrating a semiconductor device according to an eighth embodiment of the present invention.

Please refer to FIG. 12. FIG. 12 is a schematic drawing illustrating a semiconductor device 108 according to an eighth embodiment of the present invention. As shown in FIG. 12, in the semiconductor 108, all of the first field plates FP1 may be electrically connected with the first gate structure GS1, and all of the second field plates FP2 may be electrically connected with the second source region (not shown in FIG. 12). In other words, each of the first field plates FP1 may be the field plate F11 electrically connected with the first gate structure GS1, and each of the second field plates FP2 may be the field plate F12 electrically connected with the second source region for avoiding the negative influence of the first connection structure CS1 overlapping the field plate which is not electrically connected with the first connection structure CS1 and the second connection structure CS2 overlapping the field plate which is not electrically connected with the second connection structure CS2.

Figure 13:
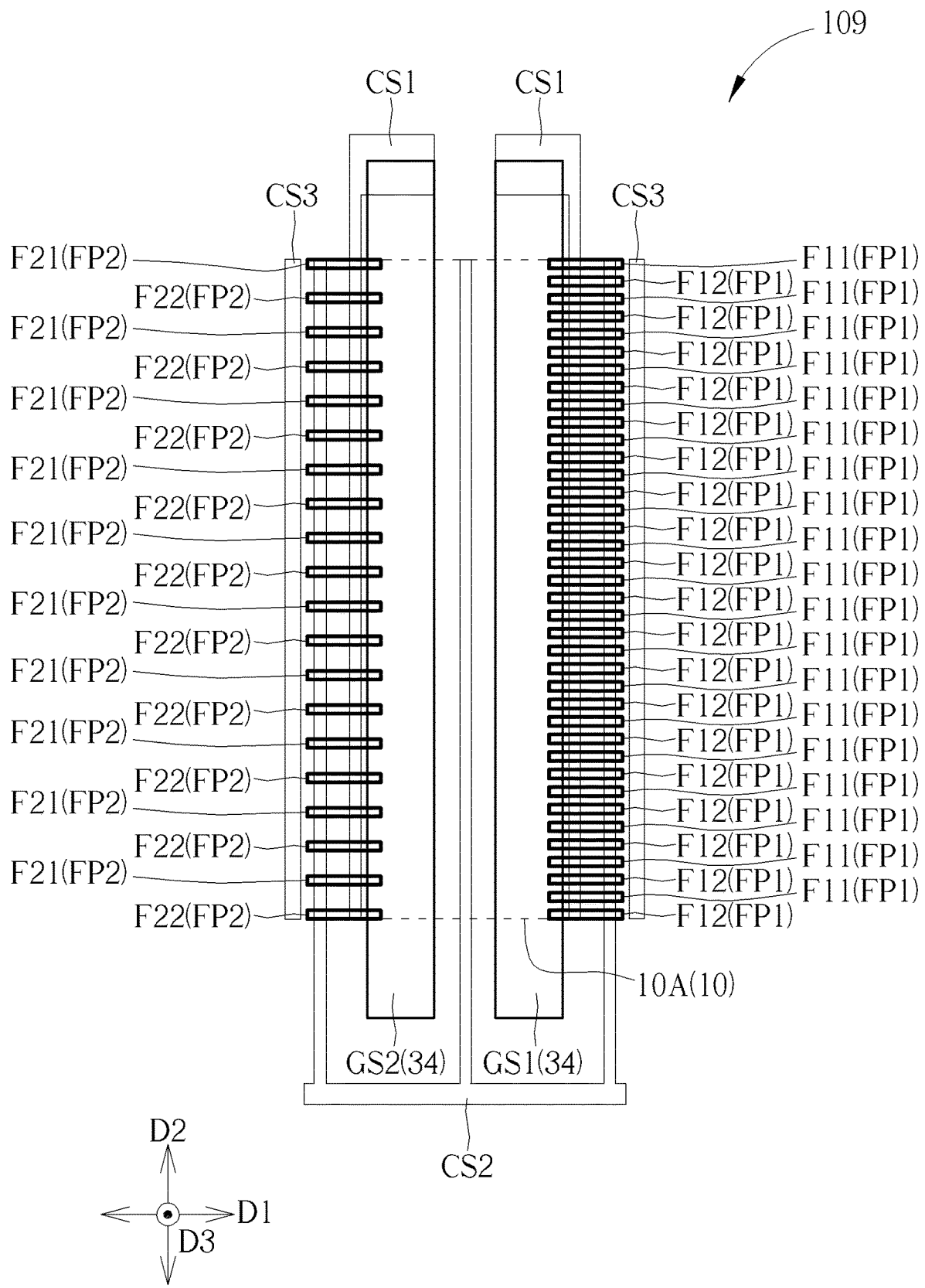
FIG. 13 is a schematic drawing illustrating a semiconductor device according to a ninth embodiment of the present invention.

Please refer to FIG. 13. FIG. 13 is a schematic drawing illustrating a semiconductor device 109 according to a ninth embodiment of the present invention. As shown in FIG. 13, in the semiconductor device 109, a number of the first field plates FP1 may be different from a number of the second field plates FP2, and an arrangement density of the first field plates FP1 may be different from an arrangement density of the second field plates FP2 for adjusting the effect generated by the field plates on the first gate structure GS1 and the effect generated by the field plates on the second gate structure GS2. For example, the number of the first field plates FP1 may be greater than the number of the second field plates FP2, and the arrangement density of the first field plates FP1 may be higher than the arrangement density of the second field plates FP2, but not limited thereto. Under the condition described above, the influence of the field plates electrically connected with the gate structure on the electrical properties of the semiconductor device may be relatively increased and/or the influence of the field plates electrically connected with the source region on the electrical properties of the semiconductor device may be relatively reduced when all of the first field plates FP1 are electrically connected with the first gate structure GS1 and all of the second field plates FP2 are electrically connected with the second source region (not shown in FIG. 12).

Figure 14:
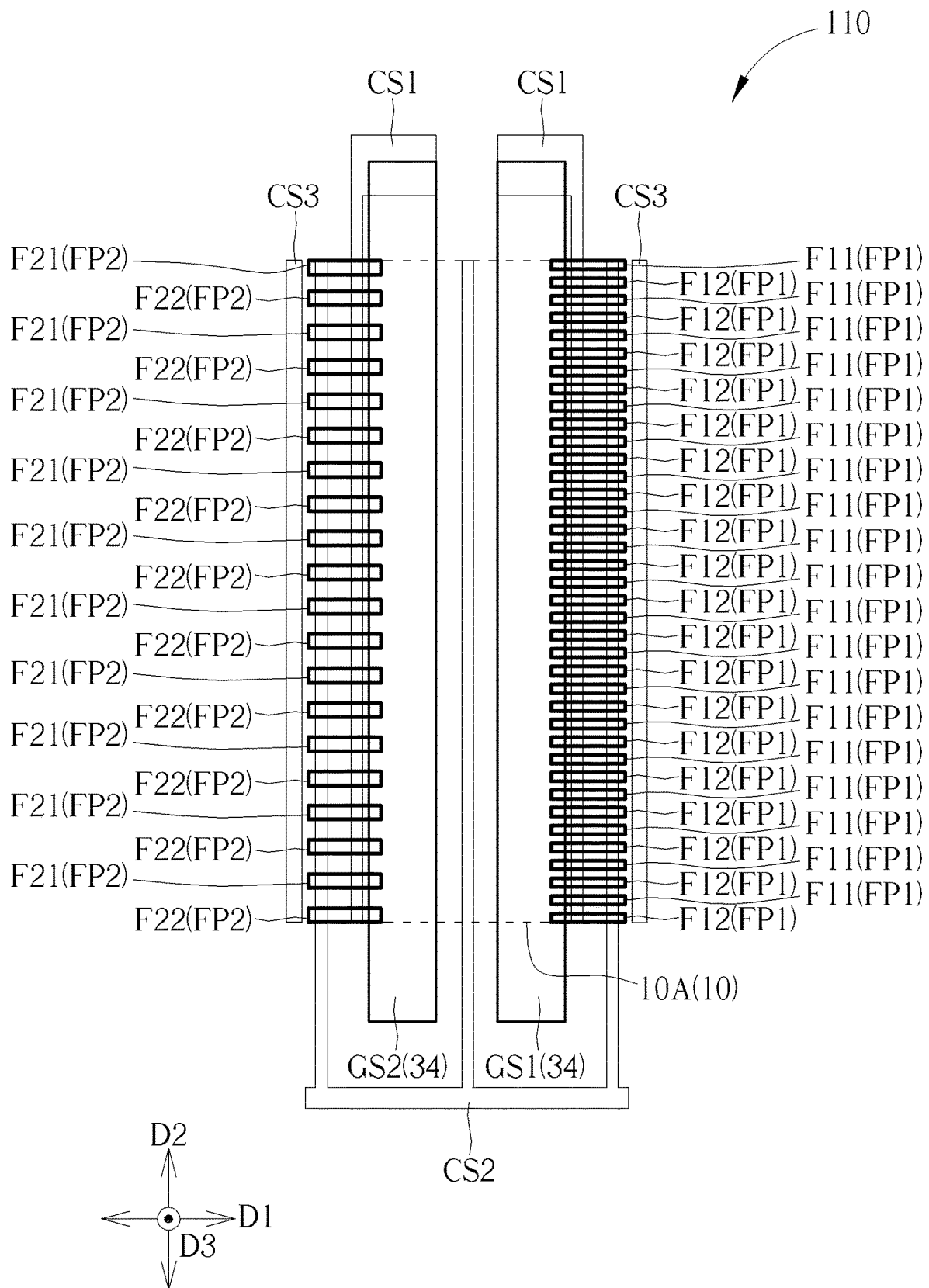
FIG. 14 is a schematic drawing illustrating a semiconductor device according to a tenth embodiment of the present invention.

Please refer to FIG. 14. FIG. 14 is a schematic drawing illustrating a semiconductor device 110 according to a tenth embodiment of the present invention. As shown in FIG. 14, in the semiconductor device 110, a dimension of at least one of the first field plates FP1 may be different from a dimension of at least one of the second field plates FP2 for adjusting the effect generated by the field plates on the first gate structure GS1 and the effect generated by the field plates on the second gate structure GS2. For example, a projection area of each of the second field plates FP2 in the third direction D3 may be greater than a projection are of each of the first field plates FP1 in the third direction D3, but not limited thereto.

To summarize the above descriptions, according to the semiconductor device in the present invention, the gate structure is electrically connected with at least one field plate and the source region is electrically connected with at least one field plate for adjusting the properties of the semiconductor device, such as the on-resistance, the gate charge, and so forth. Some specific electrical performance of the semiconductor device may be improved and/or the power loss of the semiconductor device may be reduced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a semiconductor substrate;
   a gate structure disposed on the semiconductor substrate;
   a source region and a drain region, wherein the source region and the drain region are disposed in the semiconductor substrate and located at two opposite sides of the gate structure in a first direction respectively; and
   field plates disposed on the semiconductor substrate, wherein each of the field plates is partly located above the gate structure and partly located between the gate structure and the drain region, the gate structure is electrically connected with at least one of the field plates, and the source region is electrically connected with at least one of the field plate, wherein a dimension of the field plate electrically connected with the gate structure is different from a dimension of the field plate electrically connected with the source region.

* * * * *